United States Patent [19]

Fujita

[11] Patent Number: 5,278,517

[45] Date of Patent: Jan. 11, 1994

[54] FET AMPLIFIER WITH GATE VOLTAGE CONTROL

[75] Inventor: Noriyuki Fujita, Tokyo, Japan

[73] Assignee: NEC Corporation, Japan

[21] Appl. No.: 800,999

[22] Filed: Dec. 2, 1991

[30] Foreign Application Priority Data

Nov. 30, 1990 [JP] Japan .................................. 2-330728

[51] Int. Cl.$^5$ .............................................. H03G 3/30
[52] U.S. Cl. .................................... 330/279; 330/277; 330/285; 330/296
[58] Field of Search ............... 330/127, 129, 277, 279, 330/285, 296; 455/116, 127

[56] References Cited

U.S. PATENT DOCUMENTS

| 4,748,423 | 5/1988 | Jinich ................................... 330/295 |
| 4,890,070 | 12/1989 | Benahim et al. ..................... 330/296 |

FOREIGN PATENT DOCUMENTS

| 2523782 | 9/1983 | France . |
| 0147306 | 7/1985 | France . |
| 152734 | 9/1982 | Japan .................................. 455/116 |
| 2219897 | 12/1989 | United Kingdom ................ 330/279 |

Primary Examiner—James B. Mullins
Attorney, Agent, or Firm—Ostrolenk, Faber, Gerb & Soffen

[57] ABSTRACT

In an amplifier comprising an FET (11) having a gate electrode and source and drain electrodes and a drain bias circuit (19) controlled by an output power control command to supply a drain bias to the drain electrode, a gate bias circuit (17) is controlled by the output power control command to supply the gate electrode with a controlled voltage as a gate bias. The gate bias circuit may have a voltage source terminal (25) given a predetermined voltage and comprises a gate bias control device (27) for controlling the predetermined voltage so as to develop the controlled voltage in accordance with the output power control command. Preferably, the device comprises a ROM for memorizing gate voltage data and a voltage producing section for converting the predetermined voltage to the controlled voltage in compliance with one of the gate voltage data that is selected by the command. Alternatively, the device comprises a voltage divider for dividing the predetermined voltage into divided voltages and a selector for selecting one of the divided voltages as the controlled voltage in accordance with the command.

10 Claims, 3 Drawing Sheets

FET AMPLIFIER WITH GATE VOLTAGE CONTROL

BACKGROUND OF THE INVENTION

This invention relates to an amplifier comprising a field effect transistor (FET).

In the manner which will later be described more in detail, an FET amplifier comprises a field effect transistor having a gate electrode and source and drain electrodes. The gate electrode is supplied with a gate bias voltage. As a driving power, a source-drain voltage is supplied between the source and the drain electrodes. The field effect transistor produces a source-drain current as an output signal of the amplifier with an output power level.

It is often desired to control the output power level in compliance with an output power control command. This is particularly desirable when the amplifier is put in operation by a battery. More specifically, the output power level is reduced in order to save the battery while the amplifier is kept in a standby state.

According to the prior art, the output power control command is supplied to a source-drain power supply circuit for supplying electric power of the source-drain voltage to the field effect transistor with the source-drain voltage controlled in compliance with the output power control command. In the meantime, the gate bias voltage is kept constant once the amplifier is put into operation.

In this manner, the gate bias voltage is kept constant even while the output power level is controlled. As a consequence, the source-drain current always flows with a certain constant current value through the field effect transistor when the amplifier is put either in class A operation or in class AB operation. The source-drain current of the constant current value flows even if the output power level is reduced. This results in an objectionably large power consumption and is disadvantageous particularly when it is desired to save the battery.

Furthermore, the field effect transistor is put in operation near its saturation point. It is possible in fact to reduce the source-drain current if the source-drain voltage is much reduced. This, however, puts the field effect transistor in operation in a non-saturated region to excessively reduce the source-drain current and to give rise to an unacceptably large distortion of the output signal.

SUMMARY OF THE INVENTION

It is therefore an object of the present invention to provide an amplifier which comprises a field effect transistor supplied with a gate bias voltage and a source-drain voltage and is for producing an output signal having an output power level, and in which the gate bias voltage is controlled in addition to the source-drain voltage, on controlling the output power level.

It is another object of this invention to provide an amplifier which is of the type described and in which the output power level can be reduced so as to provide low power consumption from a power source even when the amplifier is put either in class A operation or in class AB operation.

It is still another object of this invention to provide an amplifier which is of the type described and in which the output power level can be reduced without being excessively reduced.

It is yet another object of this invention to provide an amplifier which is of the type described and in which the output power level can be reduced without unacceptably large distortion introduced into the output signal.

Other objects of this invention will become clear as the description proceeds.

On setting forth the gist of this invention, it is possible to understand that an amplifier is operable with a field effect transistor put in place. In the amplifier under consideration, the field effect transistor has a gate electrode and source and drain electrodes. The amplifier comprises a gate bias circuit for supplying a gate bias voltage to the gate electrode and a source-drain voltage circuit for supplying a source-drain voltage between the source and the drain electrodes and is for producing an output signal having an output power level which is controllable by an output power control command.

According to this invention, the gate bias circuit of the above-understood amplifier is controlled by the output power control command to produce a controlled voltage as the gate bias voltage.

DESCRIPTION OF THE PREFERRED EMBODIMENTS

Figure 1:
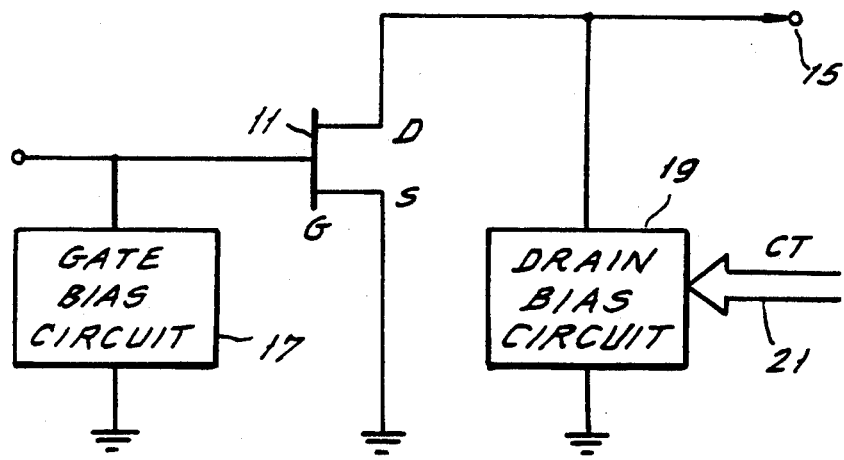
FIG. 1 is a block diagram of a conventional FET amplifier.

Referring to FIG. 1, a conventional FET (field effect transistor) amplifier will first be described in order to facilitate an understanding of the present invention. The amplifier is put in operation with a field effect transistor 11 placed in position in the manner known in the art. It will be assumed throughout the description related to the drawing figures that the field effect transistor 11 is a gallium-arsenide (GaAs) field effect transistor having a gate electrode G, a source electrode S, and a drain electrode D. The gallium-arsenide field effect transistor is, for example, the NE1069L-4B FET manufactured and sold by NEC Corporation, Tôkyô, Japan.

In FIG. 1, the source electrode S is grounded. An amplifier input terminal 13 is connected to the gate electrode G. An amplifier output terminal 15 is connected to the drain electrode D.

A gate bias voltage is supplied to the gate electrode G by a gate bias circuit 17 which may be a voltage source having a positive terminal grounded and a negative terminal used for connection to the gate electrode. A source-drain voltage is supplied by a source-drain voltage circuit 19 between the source and the drain electrodes. The source-drain voltage circuit 19 has a negative terminal grounded and a positive terminal used for connection to the drain electrode D and serves as a power source for supplying electric power of the source-drain voltage to the field effect transistor 11 as its driving power. The source-drain voltage circuit 19 may therefore be a battery of a small size when the amplifier is used in a portable radio communication device.

The source-drain voltage is herein called a drain bias voltage. The source-drain voltage circuit 19 is accordingly referred to alternatively as a drain bias circuit. When supplied with the gate and the drain bias voltages in the manner depicted, the field effect transistor 11 produces a drain-source current as a signal current, which is delivered to the amplifier output terminal 15 as an output signal of the amplifier with an output power level.

It is often desired to control the output power level in compliance with an output power control command CT which will presently be described. This is particularly desirable when the field effect transistor 11 is put in operation by a battery. In more detail, the output power level is reduced in order to save the battery while the amplifier is kept in a standby state with its operation suspended.

In FIG. 1, the output power control command CT is supplied to the drain bias circuit 19 through a control command bus 21. In the meantime, the gate bias voltage is kept constant according to the prior art once the amplifier is put into operation, although it is known that the gate bias circuit 17 is for supplying the gate bias voltage for use in controlling a channel width of the field effect transistor 11 and in thereby controlling the signal current.

It should be noted in this connection that the gate bias voltage is kept constant according to the prior art even while the output power level is controlled. As a consequence, the signal current always flows through the field effect transistor 11 with a certain constant current value when the amplifier is put either in class A operation or in class AB operation. The constant current value is approximately equal to a current value of an idling current. In this manner, the signal current of the constant current value flows even if the output power level is reduced. This results in an objectionably large power consumption and is disadvantageous particularly when it is desired to save the battery.

Furthermore, the field effect transistor 11 is put in operation near its saturation point. As a result, the signal current can not be appreciably reduced even when the drain bias voltage is subjected to a reduction of as much as two to three volts, for example, from 6 V to 3 V. A further reduction of the drain bias voltage may result in a reduction in the signal current. This, however, puts the field effect transistor 11 in operation in a non-saturated region. The output power level is therefore excessively reduced. Moreover, an unacceptably large distortion appears in the output signal.

Figure 2:
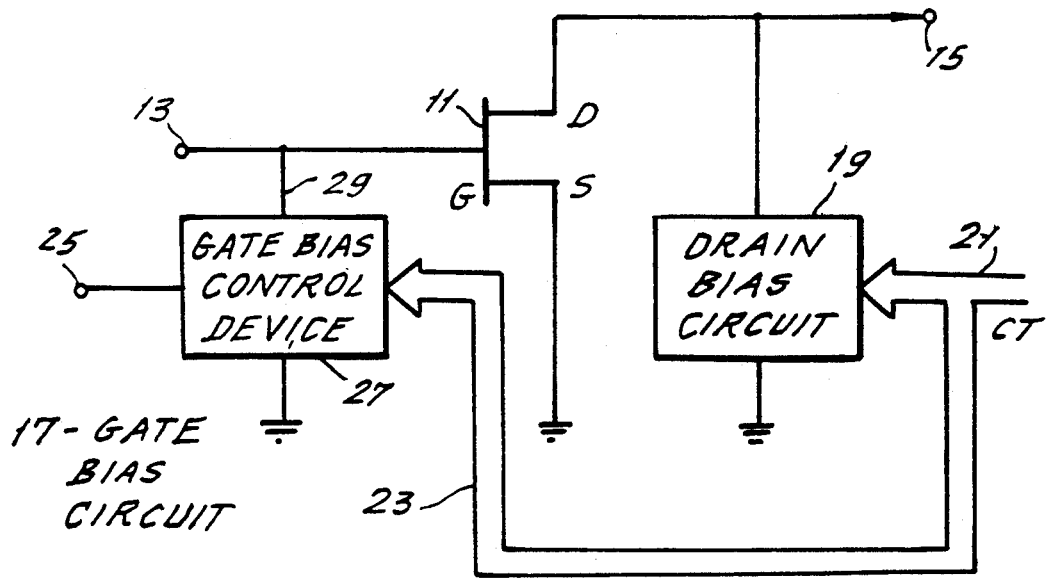
FIG. 2 is a block diagram of an FET amplifier according to the instant invention in general.

Referring to FIG. 2, the description will proceed now to an amplifier according to this invention in general. The amplifier comprises similar parts which are designated by like reference symbols and are similarly operable with likewise named signals.

In marked contrast to the conventional FET amplifier illustrated with reference to FIG. 1, the illustrated amplifier comprises a gate bias circuit which is again designated by the reference numeral 17 merely for convenience of designation and is controlled by the output power control command CT supplied thereto through a bus branch 23. Controlled in this manner, the gate bias circuit 17 produces a controlled voltage as the gate bias voltage. It will be presumed that the output power control command indicates a reduction in the output power level of the signal current of the field effect transistor 11 or of the output signal of the amplifier.

Quite unexpectedly, it has been confirmed by the present inventor that the signal current is given a reduction of a few scores of milliamperes when the gate bias voltage is given a change of only 0.1 V. As a consequence, it is possible to excellently reduce the power consumption. As a result of a small change given to the gate bias voltage, the field effect transistor 11 is kept in operation in a saturated region. This avoids an excessive reduction in the signal current when the output power level is reduced. Furthermore, no unacceptable distortion is introduced into the output signal.

Referring more particularly to FIG. 2, the gate bias circuit 17 has a voltage source terminal 25 to which a voltage source (not shown) supplies a predetermined voltage of a negative value. It is preferred that the voltage source is a power source also used in feeding the drain bias circuit 19. In any event, it is now understood that the voltage source terminal 25 serves as a voltage source section for producing the predetermined voltage. It should be noted in this connection that the gate bias circuit 17 may be fed from the power source also in the conventional FET amplifier.

A gate bias control device 27 is connected to the voltage source section (25) and is supplied with the output power control command CT through the bus branch 23. The gate bias control device 27 is for controlling the predetermined voltage so as to supply the gate electrode G with the controlled voltage described above.

A voltage supply lead 29 is connected to the gate bias control device 27 and is extended outwardly of the gate bias control device 27 for connection to the gate electrode G of the field effect transistor 11. The voltage supply lead 29 serves in this manner as a supply section. Connected to the gate bias control device 27, the supply section (29) supplies the controlled voltage to the gate electrode as the gate bias voltage.

In summary, the gate bias circuit 17 comprises the voltage source section (25), the gate bias control device 27, and the supply section (29). Controlled by the output power control command CT, the gate bias control device 27 produces the controlled voltage for supply to the gate electrode G as the gate bias voltage.

Figure 3:
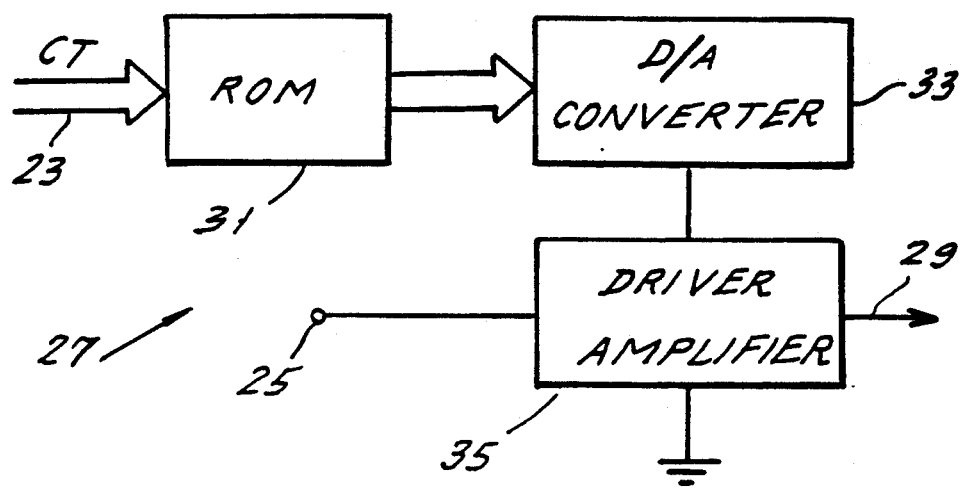
FIG. 3 is a block diagram of a gate bias control device for use in an FET amplifier according to a first embodiment of this invention.

Turning to FIG. 3, disclosed is a gate bias control device 27 for use in an FET amplifier according to a first embodiment of this invention. Like in FIG. 2, the gate bias control device 27 is connected to the voltage source terminal 25 and is supplied with the output power control command CT through the bus branch 23 to control the predetermined voltage of the power source section (25) to develop the controlled voltage.

The gate bias control device 27 comprises a read-only memory (ROM) 31 having a plurality of memory addresses for memorizing several gate voltage data. The output power control command CT is used as an address signal for the memory addresses. The bus branch 23 therefore serves as a selecting section. Connected to the memory 31 and supplied with the output power control command, the selecting section (23) selects one of the gate voltage data as a selected datum in accordance with the output power control command. Alternatively, the bus branch 23 serves as a reading section. Connected to the memory 31 and supplied with the output power control command, the reading section (23) reads one of the gate voltage data that is selected by the output power control command as a selected datum. Such a selected datum is produced from the memory 31.

A digital-to-analog (D/A) converter 33 is connected to the memory 31 to convert the selected datum to an analog datum. A driver amplifier 35 is connected to the power source terminal 25, the digital-to-analog converter 33, and the voltage supply lead 29. Energized by the predetermined voltage and in response to the analog datum, the driver amplifier 35 produces the controlled voltage for supply to the gate electrode G as the gate bias voltage. The driver amplifier 35 may be a polarity inverting circuit. It is now understood that a combination of the digital-to-analog converter 33 and the driver amplifier 35 serves as a voltage producing section. Connected to the voltage source section (25), the supply section (29), and the selecting or the reading section (23), the voltage producing section (33, 35) produces the controlled voltage for supply to the gate electrode. Alternatively, the voltage producing section may be another combination of the voltage source section (25) and the voltage producing section (33, 35) which is first described.

Figure 4:
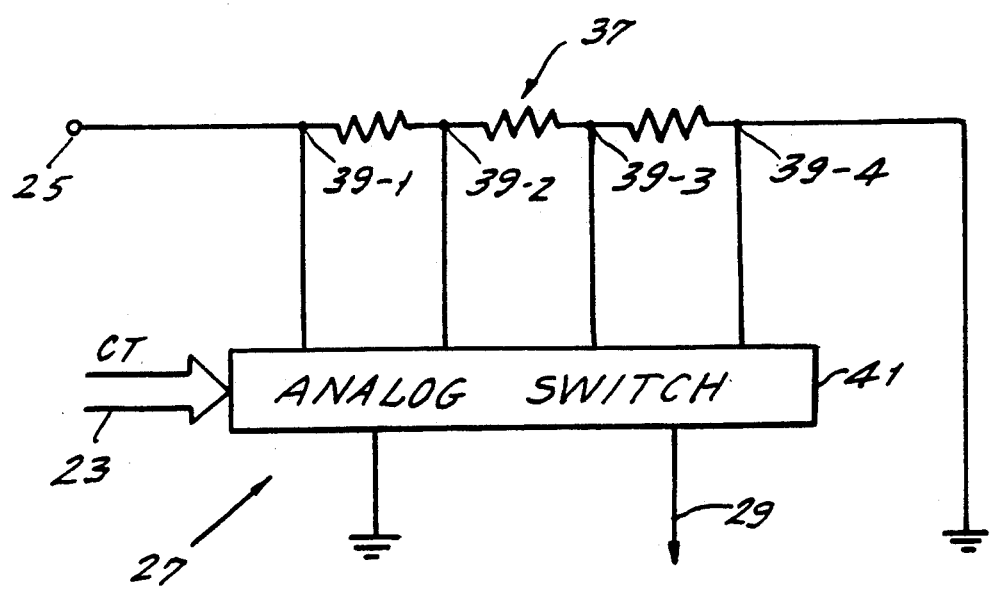
FIG. 4 is a block diagram of a gate bias control device for use in an FET amplifier according to a second embodiment of this invention.

Further turning to FIG. 4, this figure shows a gate bias control device 27 for use in an FET amplifier according to a second embodiment of this invention. Like in FIGS. 2 and 3, the gate bias control device 27 is connected to the voltage source terminal 25 and is supplied with the output power control command CT through the bus branch 23.

The gate bias control device 27 comprises a voltage divider 37 comprising, in turn, resistors which are connected in series at first through fourth points 39-1, 39-2, 39-3, and 39-4 to the voltage source terminal 25, to each other, and to ground. Being so connected, the voltage divider 37 produces first through fourth divided voltages at the first through the fourth points 39 (suffixes omitted) of connection. Although only four resistors are depicted, it is preferred to connect six or seven resistors in series. The voltage source terminal 25 may not be supplied from the power source for the drain bias circuit 19 but from a separate voltage source of about minus 5 V. Each resistor may have a resistance value of about 10 kω.

A selector or analog switch 41 is connected to the first through the fourth points 39 of connection of the voltage divider 37. Supplied with the output power control command CT, the selector 41 selects one of the divided voltages as the controlled voltage mentioned above. The supply section (29) is connected to the selector 41 to supply the controlled voltage to the gate electrode G as the gate bias voltage.

Figure 5:
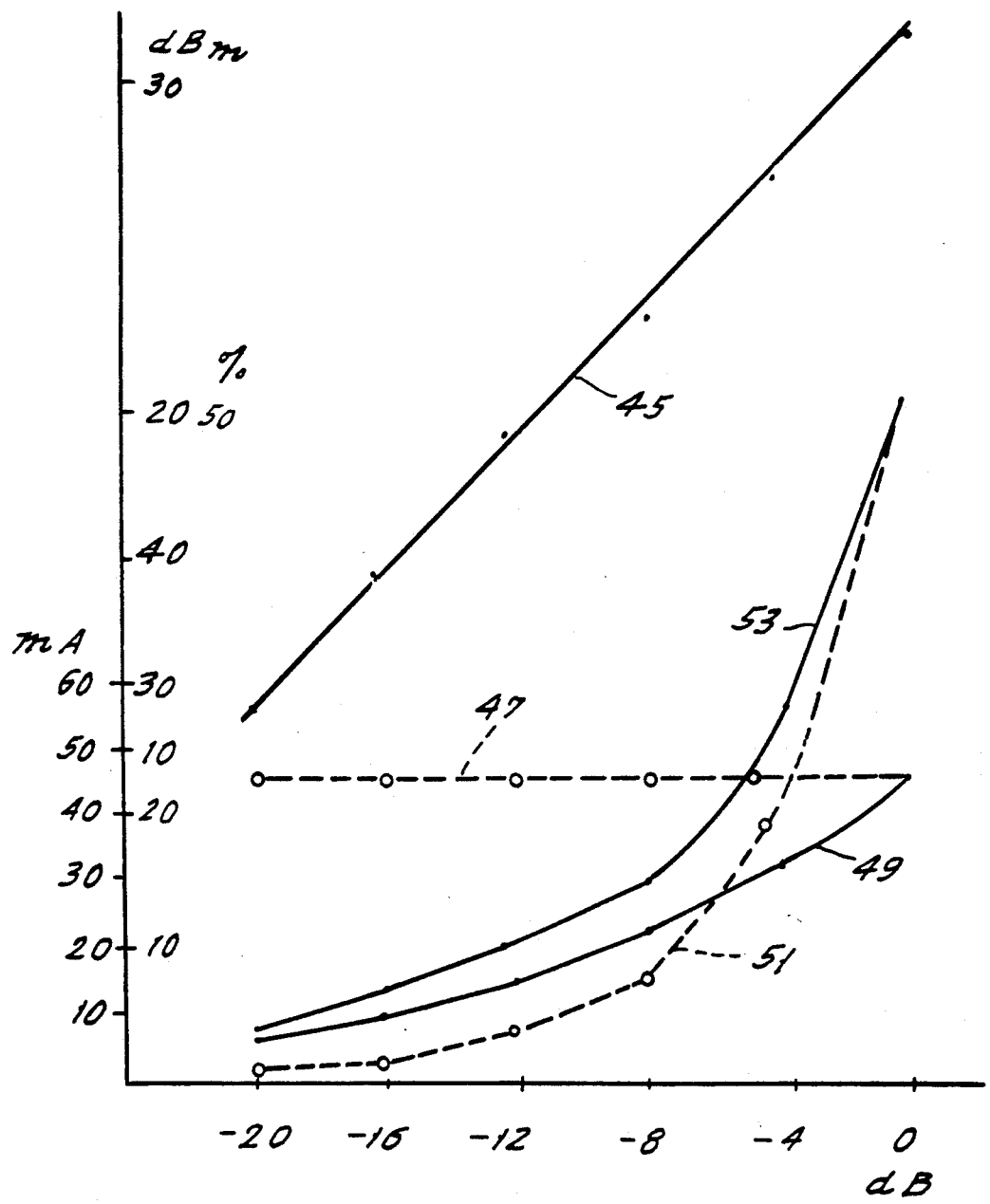
FIG. 5 schematically shows several characteristic curves for use in describing merits achieved by this invention.

Referring to FIG. 5, experiments were performed in connection with FET amplifiers which were actually manufactured according to prior art and to the this invention. A drain voltage of 5.8 V was used in both cases as the drain bias voltage. The idling current was 450 mA.

Output power control is indicated along the abscissa in dB. Along the ordinate, the output power level is scaled in dBm, the signal current in mA, and an efficiency in percent.

The output level was controlled in the manner illustrated by a nearly straight line 45. The signal current was changed as indicated by a dashed-line curve 47 according to the prior art and by a solid-line curve 49 according to this invention. The efficiency varied as shown by another dashed-line curve 51 according to the prior art and by another solid-line curve 53 according to this invention. It is clear from the figure that the FET amplifier is much improved by this invention.

Reviewing FIGS. 3 and 4, it is readily possible to make the gate bias control device 27 produce the controlled voltage in various voltage ranges to cope with the field effect transistor 11 (FIG. 1 or 2) of a variety of types. In FIG. 3, the gate voltage data can preliminarily be written in the read-only memory 31 in compliance with a gate bias voltage range which is suitable to the field effect transistor under consideration. In FIG. 4, the resistors of the voltage divider 37 can be given resistance values selected to adapt the divided voltages to the gate bias voltage of the field effect transistor in question. In addition, it is possible in FIG. 4 to select the gate bias voltage range by selecting the voltage source which should be connected to the voltage source terminal 25.

To speak of FIG. 2, it is preferred in practice to use a choke coil or the like between the amplifier input terminal 13 and the gate bias circuit 17 and between the amplifier output terminal 15 and the drain bias circuit 19. Use of a capacitor is preferred between ground and a point of connection of the choke coil or the like to the gate bias circuit 17 and another point of connection of the choke coil or the like to the drain bias circuit 19.

While this invention has thus far been described in specific conjunction with only a few preferred embodiments thereof, it will now be readily possible for one skilled in the art to put this invention into effect in various other manners. For example, the field effect transistor 11 may not necessarily be a gallium-arsenide field effect transistor in the manner already pointed out reviewing FIGS. 3 and 4. It is possible to use the output power control command CT on raising the output power level on putting the FET amplifier, for example, in an active state from the standby state.

What is claimed is:

1. An amplifier operable with a field effect transistor, said field effect transistor having a gate electrode and source and drain electrodes, said amplifier comprising a gate bias circuit for supplying a gate bias voltage to said gate electrode, and a source-drain voltage circuit for supplying a source-drain voltage between said source and said drain electrodes and producing an output signal having an output power level which is controlled by an output power control command, wherein said gate bias circuit is controlled by said output power control command so that said gate bias voltage is reduced when said output power is reduced;

wherein said gate bias circuit comprises:

voltage source means for producing a predetermined voltage;

a gate bias control device connected to said voltage source means and supplied with said output power control command for controlling said predetermined voltage to produce said controlled voltage in accordance with said output power control command; and supply means connected to said gate voltage control device for supplying said controlled voltage to said gate electrode as said gate bias voltage;

wherein said gate bias control device comprises:

a memory for memorizing a plurality of gate voltage data;

selecting means connected to said memory and supplied with said output power control command for selecting one of said gate voltage data as a selected datum in accordance with said output power control command to make said memory produce said selected datum; and voltage producing means connected to said voltage source means, said supply means, and said memory for producing said controlled voltage in compliance with said selected datum.

2. An amplifier as claimed in claim 1, wherein said gate bias voltage is reduced in response to said output power control command, so as to reduce a source-drain current of said field effect transistor and thereby reduce power consumption therein.

3. An amplifier operable with a field effect transistor said field effect transistor having a gate electrode and source and drain electrodes, said amplifier comprising a gate bias circuit for supplying a gate bias voltage to said gate electrode, and a source-drain voltage circuit for supplying a source-drain voltage between said source and said drain electrodes and producing an output signal having an output power level which is controlled by an output power control command, wherein said gate bias circuit is controlled by said output power control command so that said gate bias voltage is reduced when said output power is reduced;

wherein said gate bias circuit comprises:

voltage source means for producing a predetermined voltage;

a gate bias control device connected to said voltage source means and supplied with said output power control command for controlling said predetermined voltage to produce said controlled voltage in accordance with said output power control command; and supply means connected to said gate voltage control device for supplying said controlled voltage to said gate electrode as said gate bias voltage;

wherein said gate bias control device comprises:

a memory for memorizing a plurality of gate voltage data;

reading means connected to said memory and supplied with said output power control command for reading one of said gate voltage data that is selected by said output power control command as a selected datum, said reading means being for making said memory produce said selected datum; and voltage producing means connected to said voltage source means, said supply means, and said memory for producing said controlled voltage in compliance with said selected datum.

4. An amplifier as claimed in claim 3, wherein said gate bias voltage is reduced in response to said output power control command, so as to reduce a source-drain current of said field effect transistor and thereby reduce power consumption therein.

5. An amplifier operable with a field effect transistor, said field effect transistor having a gate electrode and source and drain electrodes, said amplifier comprising a gate bias circuit for supplying a gate bias voltage to said gate electrode, and a source-drain voltage circuit for supplying a source-drain voltage between said source and said drain electrodes and producing an output signal having an output power level which is controlled by an output power control command, wherein said gate bias circuit is controlled by said output power control command so that said gate bias voltage is reduced when said output power is reduced;

wherein said gate bias circuit comprises:

voltage source means for producing a predetermined voltage;

a gate bias control device connected to said voltage source means and supplied with said output power control command for controlling said predetermined voltage to produce said controlled voltage in accordance with said output power control command; and supply means connected to said gate voltage control device for supplying said controlled voltage to said gate electrode as said gate bias voltage;

wherein said gate bias control device comprises:

a voltage divider connected to said voltage source means and comprising resistors connected in series at points of connection to produce a plurality of divided voltages into which said predetermined voltage is divided; and a selector connected to said points of connection and to said supply means and supplied with said output power control command for selecting one of said divided voltages as said controlled voltage in accordance with said output power control command.

6. An amplifier as claimed in claim 5, wherein said gate bias voltage is reduced in response to said output power control command, so as to reduce a source-drain current of said field effect transistor and thereby reduce power consumption therein.

7. An amplifier operable with a field effect transistor, said field effect transistor having a gate electrode and source and drain electrodes, said amplifier comprising a gate bias circuit for supplying a gate bias voltage to said gate electrode, and a source-drain voltage circuit for supplying a source-drain voltage between said source and said drain electrodes and producing an output signal having an output power level which is controlled by an output power control command, wherein said gate bias circuit is controlled by said output power control command so that said gate bias voltage is reduced when said output power is reduced;

wherein said gate bias circuit comprises:

a memory for memorizing a plurality of gate voltage data;

selecting means connected to said memory and supplied with said output power control command for selecting one of said gate voltage data as a selected datum in accordance with said output power control command to make said memory produce said selected datum;

voltage producing means connected to said memory for producing said controlled voltage in compliance with said selected datum; and supply means connected to said voltage producing means for supplying said controlled voltage to said gate electrode.

8. An amplifier as claimed in claim 7, wherein said gate bias voltage is reduced in response to said output power control command, so as to reduce a source-drain current of said field effect transistor and thereby reduce power consumption therein.

9. An amplifier operable with a field effect transistor, said field effect transistor having a gate electrode and source and drain electrodes, said amplifier comprising a gate bias circuit for supplying a gate bias voltage to said gate electrode, and a source-drain voltage circuit for supplying a source-drain voltage between said source and said drain electrodes and producing an output signal having an output power level which is controlled by an output power control command, wherein said gate bias circuit is controlled by said output power control command so that said gate bias voltage is reduced when said output power is reduced;
wherein said gate bias circuit comprises:
a voltage divider comprising resistors connected in series at points of connection;
voltage source means connected to said voltage divider for supplying a predetermined voltage to said voltage divider to make said voltage divider produce a plurality of divided voltages at said points of connection;
a selector connected to said points of connection and supplied with said output power control command for selecting one of said divided voltages as a selected voltage in accordance with said output power control command; and
supply means connected to said selector for supplying said selected voltage to said gate electrode as said controlled voltage.

10. An amplifier as claimed in claim 9, wherein said gate bias voltage is reduced in response to said output power control command, so as to reduce a source-drain current of said field effect transistor and thereby reduce power consumption therein.

* * * * *